United States Patent [19]

Giuliani et al.

[11] Patent Number: 4,462,088

[45] Date of Patent: Jul. 24, 1984

[54] ARRAY DESIGN USING A FOUR STATE CELL FOR DOUBLE DENSITY

[75] Inventors: Sylvester W. Giuliani, Wappingers Falls; SeJung Park, Newburgh, both of N.Y.

[73] Assignee: International Business Machines Corporation, Armonk, N.Y.

[21] Appl. No.: 317,721

[22] Filed: Nov. 3, 1981

[51] Int. Cl.³ .................... G11C 11/36; G11C 17/06
[52] U.S. Cl. ..................................... 365/105; 365/45
[58] Field of Search ................... 365/105, 103, 45

[56] References Cited

U.S. PATENT DOCUMENTS

| | | | |
|---|---|---|---|
| 3,423,646 | 1/1969 | Cubert et al. | 365/105 |
| 3,484,762 | 12/1969 | Meier | 340/174 |
| 3,656,117 | 4/1972 | Maley et al. | 340/173 SP |
| 3,818,724 | 6/1974 | Bourgeois | 365/105 |
| 4,174,521 | 11/1979 | Neale | 357/45 |
| 4,202,044 | 5/1980 | Beilstein, Jr. et al. | 365/182 |

OTHER PUBLICATIONS

1980 IEEE International Solid-State Circuits Conference, Feb. 14, 1980, p. 108, A Numeric Data Processor, R. Nave et al.

1981 IEEE International Solid-State Circuits Conference, Digest of Technical Papers, Feb. 19, 1981, pp. 116–117, The Interface Processor for the 32b Computer, J. Bayliss et al.

Primary Examiner—George G. Stellar
Attorney, Agent, or Firm—John F. Ohlandt; Wesley DeBruin

[57] ABSTRACT

A bipolar ROM (read only memory) or ROS (read only storage) system in which the array devices embody four different, two-terminal, device forms: low barrier Schottky diodes; standard or high barrier, Schottky diodes; junction diodes; and no diodes; thereby to make possible four levels of storage for each cell. This effectively doubles the information content for an array with litle increase in the array size.

6 Claims, 7 Drawing Figures

| V SENSE OUTPUTS | V NO DIODE | V PN DIODE | V SBD | V LBSBD |
|---|---|---|---|---|
| OUT A | 1 | 1 | 0 | 0 |
| OUT B | 1 | 0 | 0 | 1 |

ARRAY DESIGN USING A FOUR STATE CELL FOR DOUBLE DENSITY

BACKGROUND OF THE INVENTION

1. Field of the Invention

The present invention relates to information storage and retrieval, and more particularly to read only memory or storage systems using a variety of two terminal, bipolar devices in single device storage cells to achieve four levels of storage for each cell.

2. Background Information

As memory technology has developed over the past several decades, it has become well known to provide two dimensional arrays of storage cells each holding one data bit. In the evolution of semiconductor integrated circuits, a great deal of attention has been focused on achieving high density read only storage (ROS). As one example, systems have been proposed in which each cell in an integrated circuit array has been constituted of a single field effect transistor (FET), sometimes designated MOS or HMOS depending upon the form of the device. ROS integrated circuit memories have generally specified the state of a given cell by either including or omitting the gate connection to a particular FET. Accordingly, when that particular cell is addressed, one of two different voltage levels appears on a bit line. These voltage levels are then sensed to provide a binary signal output.

In the ever increasing effort to achieve greater storage density, there have been a variety of proposals to increase the number of different signal levels which can be stored within one cell. For example, three and four-level schemes have been disclosed which seek to increse significantly the information content for an array, with little increase in array size.

In order that the context of the present invention may be thoroughly understood and appreciated, reference may be made to the following patents and publications which disclose relevant concepts of ROS systems, particularly systems involving storage levels greater than two per cell:

| U.S. Pat. No. | 3,484,762 | D. A. Meier |
| | 3,656,117 | G. A. Maley et al |
| | 4,174,521 | R. G. Neale |
| | 4,202,044 | K. E. Beilstein, Jr. et al |

Also reference may be made to the following publications: 1980 IEEE International Solid State Circuits Conference Digest at page 108 (entitled "THE NUMERIC DATA PROCESSOR" by Rafi Nave et al) and 1981 IEEE Solid State Circuits Conference Digest at page 116 (entitled "THE INTERFACE PROCESSOR FOR THE 32b COMPUTER" by Bayliss et al [see FIG. 1]).

The above cited Beilstein patent and the cited publications are regarded as particularly pertinent pieces of background information because they disclose or suggest four levels of storage for their particular memory cells. The Neale patent is pertinent in that it does indicate that its proposed memory cell may store various levels or states as a function of the cross sectional area of the single crystal column created in a semiconductor structure; the cross sectional area of the column being a function of the voltage applied and the duration of application during a so-called programming step, involving solid-phase epitaxial growth. This patent also notes that by proper selection of an alloy layer and of impurity conductivity type and concentration, a particular type of diode barrier can be formed.

Another reference that may be useful as background material is copending application Ser. No. 169,542, July 17, 1980, assigned to the assignee of the present application. That copending application discloses a read only storage system involving a storage matrix having a number of cells, each cell comprising a field effect transistor possessing one of three different gate configurations, said configurations including an enhancement-mode gate, a depletion-mode gate, and no gate, such that the cells are capable of producing three-level signals depending upon the gate configuration.

SUMMARY OF THE INVENTION

Whatever the merits of the aforenoted storage devices and systems disclosed in the references, certain objects, features, and advantages have not been achieved thereby.

Accordingly, it is a primary object of the present invention to realize a simple and efficient ROM or ROS system having two-terminal storage cells which can store four levels or states.

Another object is to achieve almost a one hundred percent increase in storage capacity with the same number of single device cells as are conventionally formed in storage arrays; in other words, to virtually double the storage available in a given array size.

A specific object is to accomplish the previous objects in a way that involves the addition of only slightly different masking steps from those that are conventionally employed in the ROS manufacturing process.

The above, as well as other objects, are fulfilled and implemented by the several features of the invention. Broadly stated, the invention resides in the provision of an ROS system including a matrix or array of cells, each cell being constituted of a single two-terminal, device. Each device in a given cell is provided in one of four possible device forms: a PN junction diode, a standard or high barrier Schottky diode, a low barrier Schottky diode or an open circuit (no device). Reliance is placed upon the fact that the two terminal devices possess sufficiently different non-linear VI characteristics that they provide readily sensed differences in forward voltage responses when addressed on the word and bit lines formed as part of the array. Moreover, array simplicity is achieved in that the drive signals are applied to the respective two terminals in the addressing or selecting operation.

Another specific feature of the invention resides in the fact that each of the cells in the memory array of the present invention is equal in area to any other cell precisely because each is constituted of a single non-linear device having the same area as any other non-linear device.

It will be appreciated from what has been indicated previously that at each and every storage location there can be any one of the four different voltage levels; and that these four levels can be encoded into two binary outputs. Consequently, two bits of information can effectively be stored in a single cell area with little or no increase in the size of the array per se. Of course, as will be explained hereinafter, certain peripheral circuits must be added, which slightly increases the size of the chip when compared with a one bit per cell array.

A further feature of the invention resides in the combination of the novel arrangement of cells with the encoding means which forms part of the sensing means connected to the cells; more specifically, the sensing means is connected to a group of the bit lines which, in a typical array, are eighteen in number, all of which are selected at a given time. The output from the sense amplifier arrangement produces the required two binary outputs. The individual sense amplifiers are so constructed that they compare the individual bit line voltages to reference voltages which are suitably provided, and then perform the aforenoted translation or encoding of the four possible bit line potentials into two binary outputs. One of the two sense amplifier outputs provided is then selected by means of an additional address bit and is then clocked to an output latch. In other words, a gate means is provided at that additional address line and is so connected that it operates to select either an A or B output as called for.

Other and further objects, advantages and features of the present invention will be understood by reference to the following specification in conjunction with the annexed drawing, wherein like parts have been given like numbers.

DESCRIPTION OF PREFERRED EMBODIMENT

Figure 1:
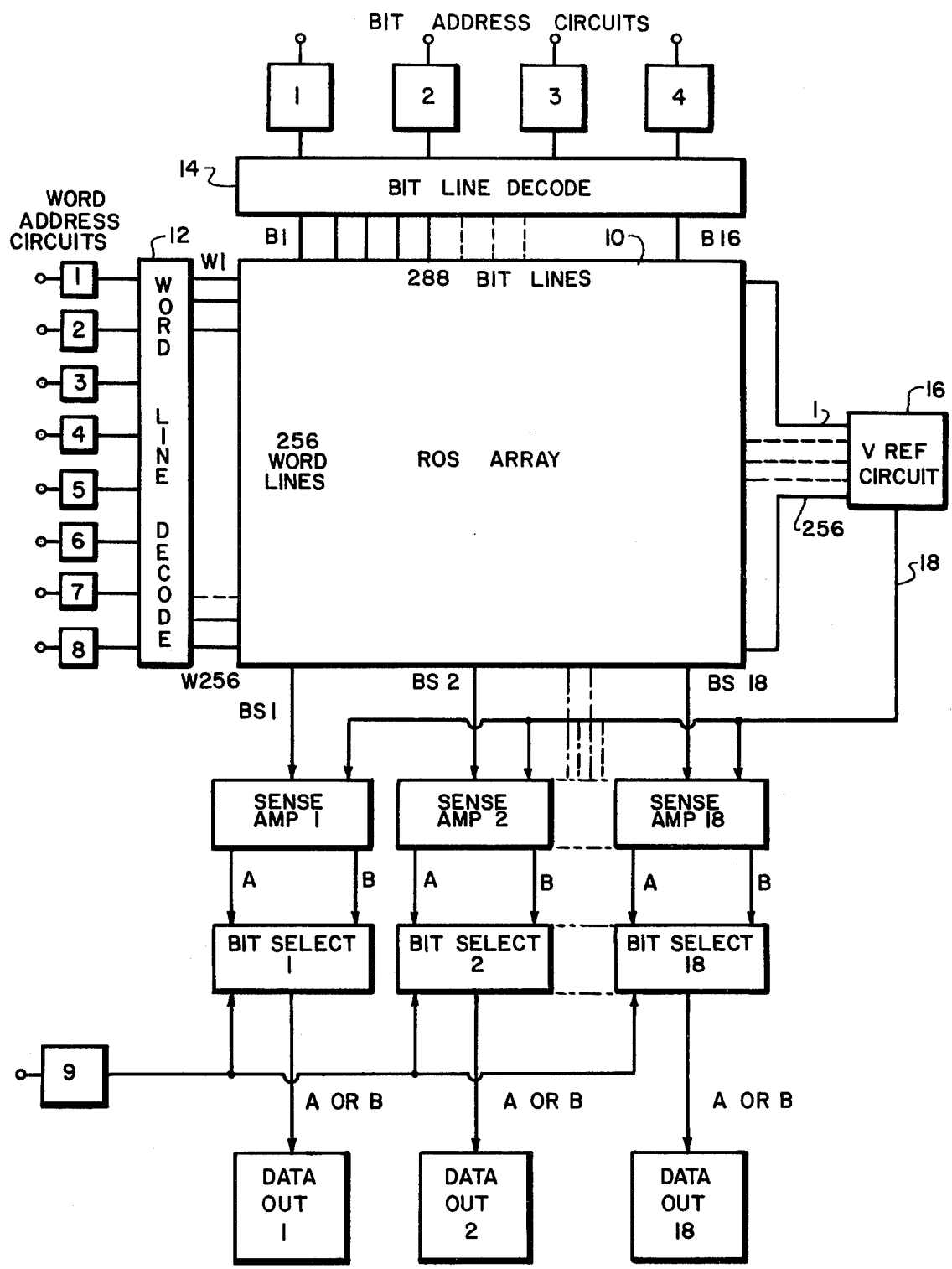
FIG. 1 is a schematic diagram of a read-only storage system in accordance with the present invention.

Referring now to FIG. 1, there is shown a complete read-only memory system which may, in accordance with current technology, be integrated on a single semiconductor chip. However, if desired, only the array 10 seen in FIG. 1 may be so integrated.

The array 10 follows conventional organization in respect to the addressing scheme; that is to say, a plurality of word address circuits designated 1-8 are connected to a conventional word line decode means 12 which results in the selective generation of W1-W256 input or drive signals on the respective word lines of the array.

Similarly, bit address circuits 1-4 are seen connected to a bit line decode means 14 which has the function of decoding the input addresses to provide selectively the sixteen input bit signals B1-B16. It is to be noted that each of these input signals is fed to eighteen bit lines within the array. Accordingly, there is a total of 288 bit lines provided in the array (resulting from the product of sixteen times eighteen). Thus in this conventional organization, eighteen bit lines are effectively selected at a given time by each of the individual input signals B1-B16 respectively.

Figure 2:
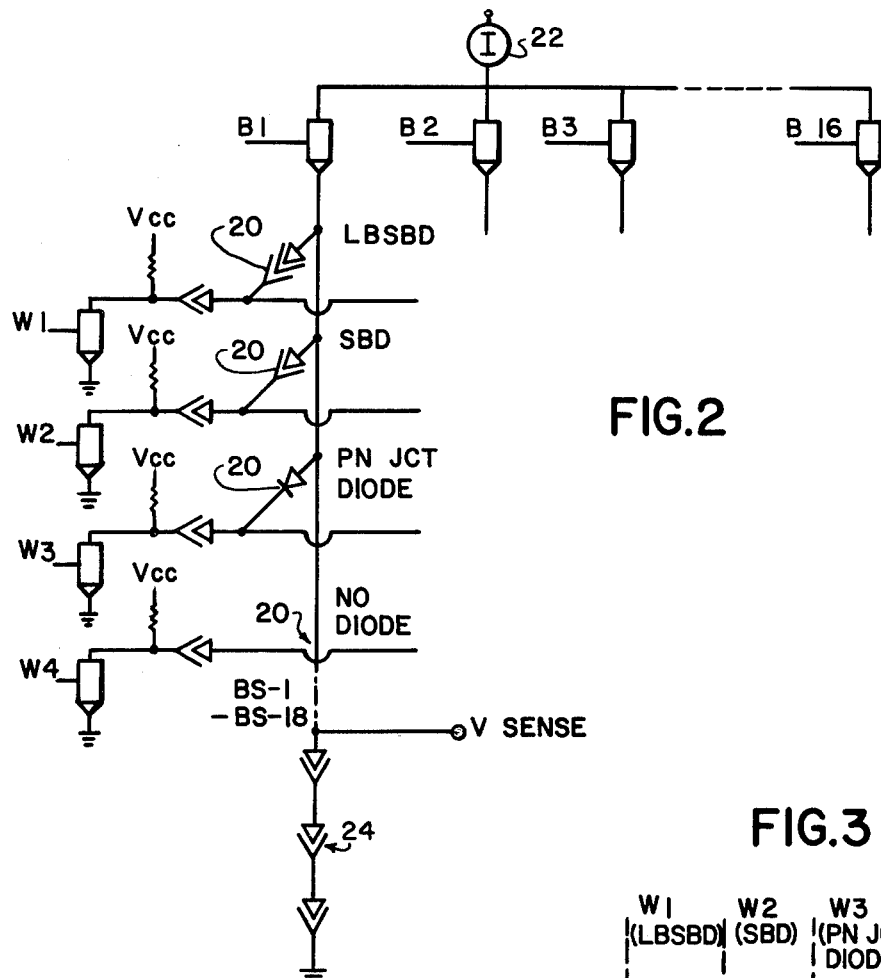
FIG. 2 is a schematic diagram illustrating a portion or fragment of the system of FIG. 1, in which there are shown the four different diode devices for providing the four voltage levels utilized in the system.

Each of the cells within the array 10 is defined by a single two-terminal device. Referring to FIG. 2, there will be seen a variety of the devices 20 in a fragmentary illustration of a single column within the array. These cell devices take four forms: a low barrier Schottky diode, a conventional (or high barrier) Schottky diode, PN junction diode and no diode.

Figure 3:
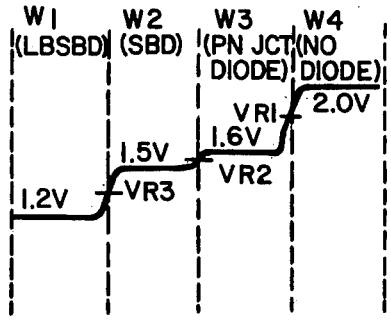
FIG. 3 is a diagram depicting the four different voltage levels together with three different reference voltages to which the four levels are compared.
Figure 4:
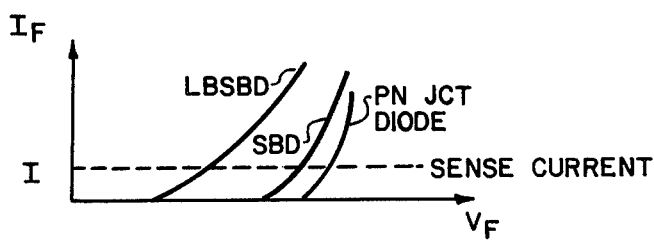
FIG. 4 is a diagram illustrating the different non-linear VI characteristics for the several devices used in the array.

The four available forward voltage levels from each of the respective elements or devices is depicted in FIGS. 3 and 4, the latter showing v-i characteristics for the various diodes, with the corresponding forward voltages obtainable for a given sense current I. the sense current I is supplied by constant current source 22 (FIG. 2). FIG. 3 also illustrates the three reference voltages to which the forward voltages (VF) are compared in accordance with the particular device being sensed at a given location. Thus, referring to the uppermost location in FIG. 2, the low barrier Schottky barrier diode present there will, when addressed, produce an output of approximately 1.2 volts, which, as can be seen, is the lowest value of forward voltage and is lower than any one of the three reference voltages. The other diodes will produce their respective output voltages such that, as depicted, readily discernible and sensible differences in voltage responses are provided.

It will be apparent from FIG. 2 that when the lowermost cell location (having no diode) is addressed, the constant current from source 22 flows through output device 24, comprising three Schottky diodes in series. Consequently, the $V_{sense}$ voltage is at the 2.0 volt value depicted in FIG. 3. Otherwise, that is when the other three cell locations are addressed selectively, the constant current flows substantially only through the particular non-linear device defining that cell. Therefore, the aforenoted respective forward voltages of such devices are sensed selectively at the $V_{sense}$ terminal.

The customization or personalization thus made available by the present invention has the great advantage that only a single two terminal diode layout need be used, the type of diode being determined by the metallurgy used in the case of a Schottky barrier diode. That is, a typical metal such as tantalum or titanium forms the requisite electrode for a low barrier Schottky diode, whereas aluminum is so disposed for a high barrier Schottky diode. In realizing a PN junction diode, a single p-type diffusion or implantation is employed. As a consequence, when compared with conventional techniques, only a few simple additional masks need be utilized in achieving the implementation of all four of the single device cells seen in FIG. 2. These, of course, can be produced selectively at any of the locations in the array 10 to achieve the desired information storage pattern.

Figures 5, 6:
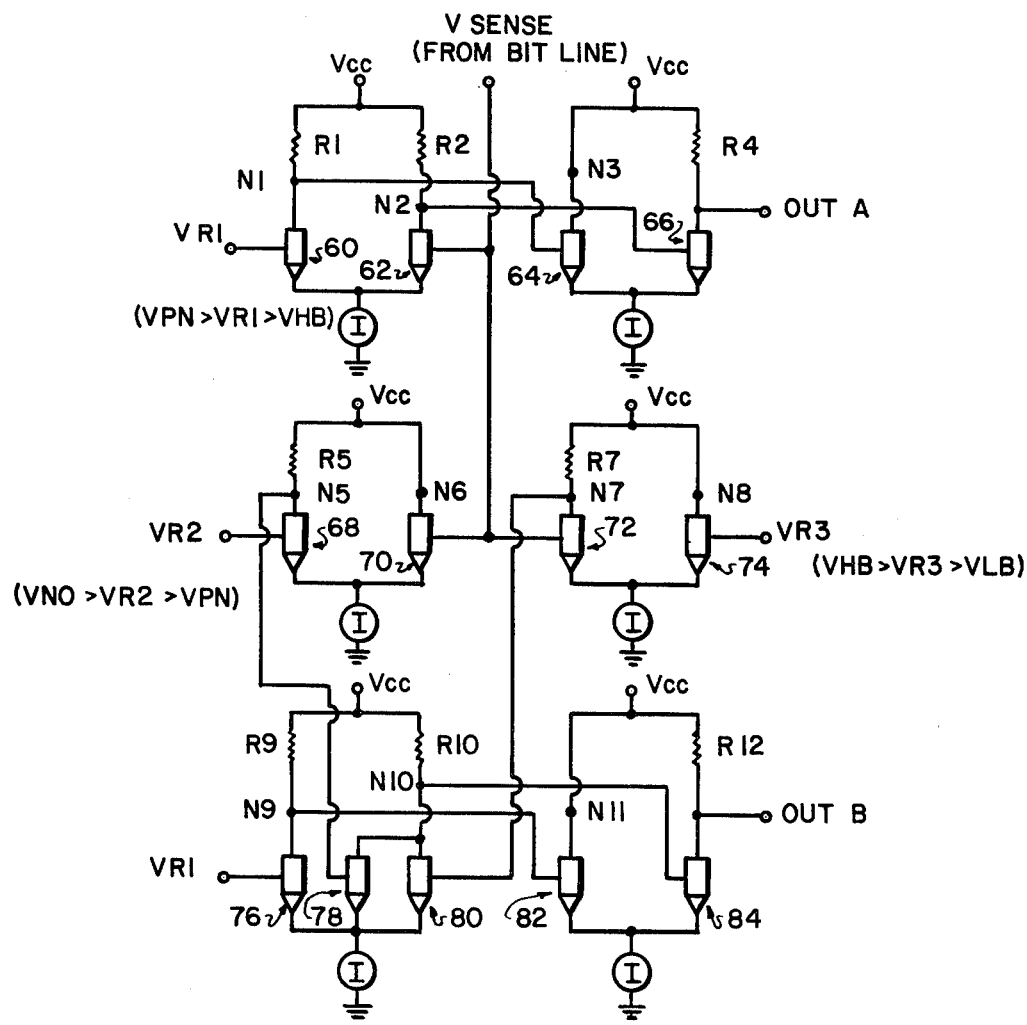
FIG. 5 is a truth table showing the combinations of binary values at the outputs A and B in accordance with the voltage sensed on the bit line corresponding with the four different devices that may be present at given locations.
FIG. 6 is a schematic diagram of a sensing and encoding means for sensing outputs from the array of FIG. 1 and for providing two binary outputs (A and B) from the four level voltage signal inputs.

At the lower end of the array 10 in FIG. 1, there will be seen a plurality of bit-sense signals (BS1-BS18) which are fed to their respective sense amplifiers (sense amp 1-sense amp 18) in order that the particular voltage level of the individual bit lines can be sensed. Additionally, conversion or encoding is performed so as to produce the outputs A and B in binary form. The truth table of FIG. 5 presents the combination of binary values for the outputs A and B of a sense amp when a voltage level, due to a particular device at a given location, is sensed. That is to say, whether there is present no diode, a p-n junction diode, a standard Schottky barrier diode, or a low barrier Schottky diode.

In the implementation of the functions for the sense amplifier and encoder, the circuit shown in FIG. 6 is adopted. The reference voltages as already discussed, have a fixed value but differ for each of the several storage devices. These reference voltages are designated $V_{R1}$, $V_{R2}$, $V_{R3}$, as previously seen in FIG. 3; $V_{PN}$ represents the forward voltage of a pn junction diode, $V_{HB}$ that of the high barrier Schottky barrier diode, $V_{NO}$, no diode and $V_{LB}$ the low barrier Schottky diode. Accordingly, $V_{NO} > V_{PN} > V_{HB} > V_{LB}$.

The circuit of FIG. 6, in which the supply voltage $V_{CC}=3.4$ volts, operates in the following manner: when a V sense signal, seen at the top of this figure, is applied on a particular bit line (such as, for example, BS1, FIG. 1) to the sense amp seen therein, and assuming that the signal has a value equal to $V_{NO}$, (where $V_{NO} > V_{R1} > V_{R2} > V_{R3}$) then transistor devices 62, 70, and 72 are on. Under these conditions collector node N1 is high while N2 is low. Therefore output A is high (defined as the "one" state). Under these same conditions, collector node N5 is high, N7 is low, N9 is high and N10 is low. Therefore, the output B is high and is in the "one" state. This "one" state for both outputs A and B conforms with the condition of V sense equal to $V_{NO}$ in accordance with the truth table (FIG. 5).

On the other hand, when $V_{sense}$ equals $V_{PN}$ (where $V_{PN} < V_{R1}, > V_{R2}, > V_{R3}$, output A is in the one state, while output B is in the low or zero state. This follows because under these conditions, transistor devices 62 and 72 are on, whereas device 70 is off. With device 70 off, this means that the collector nodes N5 and N7 are low, which in turn means that collector nodes N9 is low and N10 is high, and therefore output B is low.

In the third case when $V_{sense}$ equals $V_{HB}$ ($V_{HB} < V_{R1}, < V_{R2}, > V_{R3}$). In this case, devices 62 and 70 are off while device 72 is on. As can be verified, the output A under these conditions is low while the output at B is also low.

For the fourth state or condition for $V_{sense} = V_{LB}$ ($V_{LB} < V_{R1}, < V_{R2}, < V_{R3}$) all of the devices 62, 70, and 72 are turned off such that the output at A is low (zero state) whereas the output at B is high.

It will be appreciated that the reference voltages $V_{R1}$, $V_{R2}$, and $V_{R3}$ can be supplied internally to the sense amplifiers of FIG. 6 by means of fixed reference potentials. However, it is considered advantageous to have an arrangement as depicted in FIG. 1 in which a voltage reference circuit 16 is connected to the 256 line output of the array in order to furnish slightly varying values of $V_{R1}$, $V_{R2}$, and $V_{R3}$, by way of cable 18, as the array diodes vary. In other words, this reference voltage circuit arrangement will "track" with the array diodes as the temperature, power supply and manufacturing process are subject to variations. Because the components in this circuit 16 are made by the same integrated circuit process as the array diodes, they will follow that aforenoted variations of the array diodes.

Figure 7:
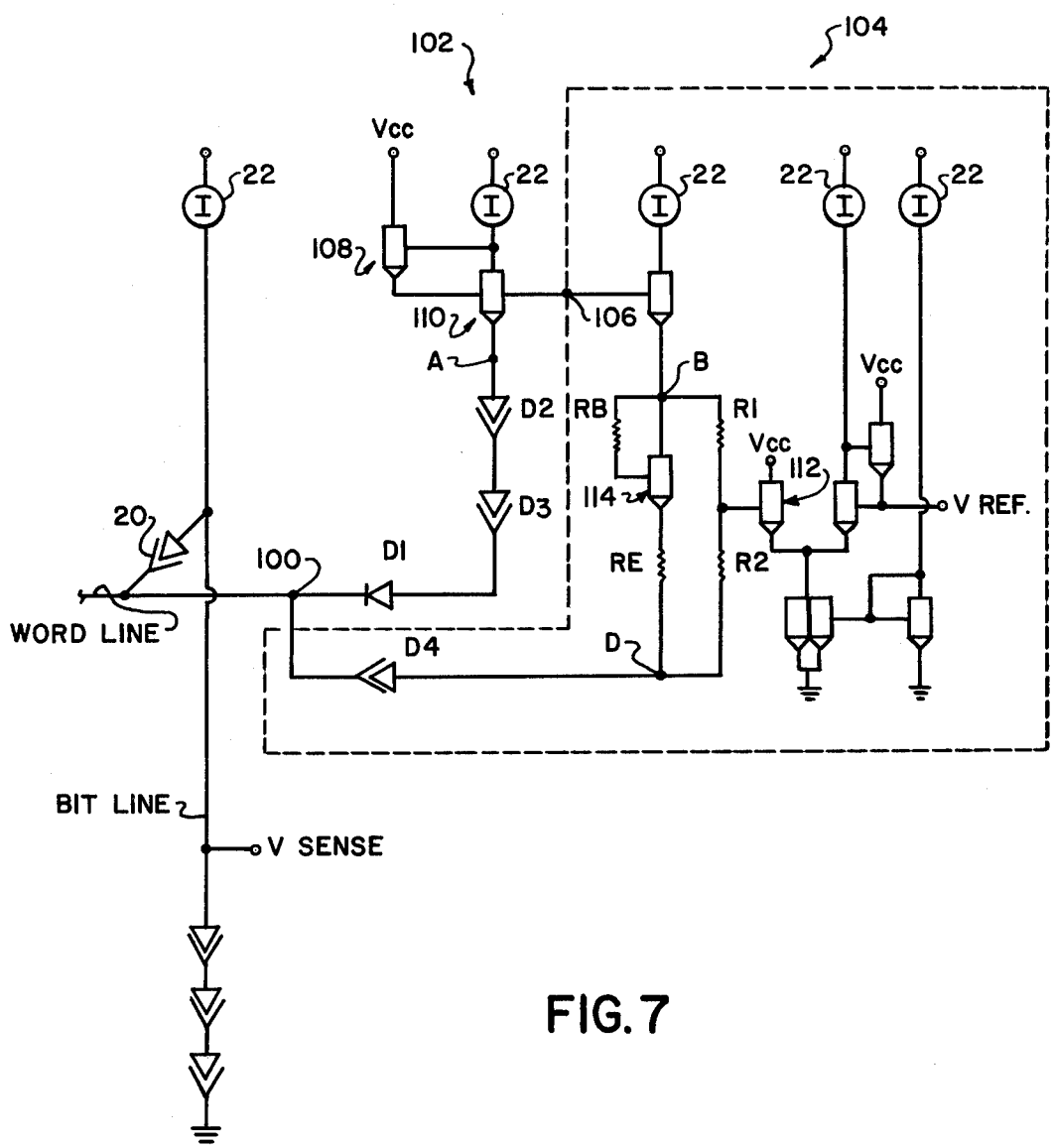
FIG. 7 is a schematic diagram of a reference voltage generator for generating the required reference voltages.

Accordingly, there will be seen in FIG. 7 a schematic diagram of the reference voltage circuit 16. This circuit is designed to operate with $V_{cc}$ equal to 3.4 volts, and with current sources 22 identical to current source 22 that drives the array diodes. Diode D1 is a PN diode, while D2, D3, and D4 are high barrier Schottky diodes. Diode D4 is used for isolation and R1=R2. For the sake of simplicity and clarity, only one typical word line and bit line is shown, with a typical storage cell 20 at their intersection. Connected to the word line at node 100 is a sub-circuit 102, including transistors 108 and 110, common to the circuitry for generating all these reference voltages; a sub-circuit 104 is seen for the particular purpose of generating one of the three reference voltages. It will be understood that the other two reference voltages are similarly provided by additional sub-circuits 104, not seen, connected to a node 106, each of those sub-circuits including another isolation diode, appropriate for the particular reference voltage, and connected to the node 100.

The diodes D1, D2, and D3 are stacked in such a way as to guarantee that all diodes sink the same amount of current (I). Since a p-n junction diode is a leaky device, other stacking arrangements will result in either of the Schottky diodes D2 or D3 or both operating to sink less current than they should. The transistor 112 is operated in the linear active region so as to absorb a large range of voltages.

It will be understood from the design of the circuit, that the voltage drop across node A and node 100 will be the same as that across node B and node 100. The voltage drop across nodes B and D will be equal to the sum of the forward voltage of diode D2 (or diode D3) and diode D1. Therefore the reference voltage $V_{ref}$ can be designed to be equal to the forward voltage of a high barrier Schottky diode plus the average of the forward voltages of high barrier Schottky NPN diodes. It should be noted that the transistor 114 can be replaced by a PNT transistor. Because of the nature of the design, the reference voltage will track with the array diodes as temperature, power supply, and the manufacturing process are varied.

There has been disclosed herein a read only storage system in which the array devices uniquely embody different, two-terminal, bipolar device forms so as to make possible four levels of storage for each cell, thereby doubling the information content for a given array size. Advantage is taken of the fact that the two-terminal bipolar devices possess sufficiently distinct non-linear v.i. characteristics, such that they provide readily sensed differences in forward voltage responses when addressed on the word and bit lines formed as part of the array. Moreover, array simplicity results from the fact that the drive or input signals are applied to the respective two terminals of the devices in the addressing or selecting operation.

While there have been shown and described what are considered at present to be the preferred embodiments of the present invention, it will be appreciated by those skilled in the art that modifications of such embodiments may be made. It is therefore desired that the invention not be limited to these embodiments, and it is intended to cover in the appended claims all such modifications as fall within the true spirit and scope of the invention.

We claim:

1. A semiconductor integrated circuit read-only storage system comprising:
    a storage array of cells having groups of word lines and bit lines, and including an asymmetrically conductive output device;
    each cell consisting of a two-electrode asymmetrically conductive device, or no device, each of said asymmetrically conductive devices having between its two electrodes a predetermined one of three different non-linear VI characteristics such that, when each of said cell devices conducts current of substantially the same magnitude, four readily sensed differences in forward voltage levels are provided by said cells when addressed on said word lines and bit lines of said array;

three of said forward voltage levels being selectively available across the two respective electrodes of said cell devices, the other forward voltage level being available across said output device when a no device cell is selected;

each cell device having its two electrodes directly connected to at least one word line and at least one bit line respectively;

a constant current source for selectively supplying said current of substantially the same magnitude to each of the asymmetrically conductive devices of said cells and to said output device;

means for applying input signals to said word and bit lines;

sensing means for sensing the four distinct forward voltage levels of said cells responsive to said input signals, including a bit sense line connected in common to one electrode of each of said cell devices and to said output device.

2. A system as defined in claim 1, in which the cell area is defined solely by the dimensions of said two electrode cell device, and is the same for each cell in the array.

3. A system as defined in claim 1, in which said cell devices take the form of a P-N junction, a high barrier Schottky diode, and a low barrier Schottky diode.

4. A system as defined in claim 1, in which said sensing means includes means for encoding or converting said four distinct forward voltage levels into two binary outputs.

5. A system as defined in claim 4, further comprising select means at the output of said sensing means for selecting one of the two binary outputs of said sensing means.

6. A system as defined in claim 4, further comprising a reference voltage generator connected to said word lines and providing reference voltages to said sensing means.

* * * * *

UNITED STATES PATENT AND TRADEMARK OFFICE
CERTIFICATE OF CORRECTION

PATENT NO. : 4,462,088

DATED : July 24, 1984

INVENTOR(S) : S. W. Giuliani and SeJung Park

It is certified that error appears in the above-identified patent and that said Letters Patent are hereby corrected as shown below:

Column 1, line 34, "increse' should read --increase--.
Column 2, line 62, after "can" insert --then--.
Column 4, line 19, after the period ".", "the" should start with a capital "T".
Column 5, line 61, "that" should read --the--.
Column 6, line 6, "these" should read --three--.

Signed and Sealed this

Twenty-second Day of January 1985

[SEAL]

Attest:

DONALD J. QUIGG

Attesting Officer

Acting Commissioner of Patents and Trademarks